United States Patent [19]

Laermer

[11] 4,186,422
[45] Jan. 29, 1980

[54] MODULAR ELECTRONIC SYSTEM WITH COOLING MEANS AND STACKABLE ELECTRONIC CIRCUIT UNIT THEREFOR

[75] Inventor: Lothar Laermer, Paramus, N.J.

[73] Assignee: The Singer Company, Little Falls, N.J.

[21] Appl. No.: 930,072

[22] Filed: Aug. 1, 1978

[51] Int. Cl.$^2$ .............................................. H05K 7/20
[52] U.S. Cl. .................................... 361/388; 361/387
[58] Field of Search ................................ 361/381–388; 174/15 R, 16 R, 16 HS

[56] References Cited

U.S. PATENT DOCUMENTS

| | | | |
|---|---|---|---|
| 3,518,493 | 6/1970 | Bathrick, Jr. | 361/388 |
| 3,631,325 | 12/1971 | Wenz | 361/387 |
| 3,648,113 | 3/1972 | Rathjen | 361/388 |
| 4,037,270 | 7/1977 | Ahmann | 361/385 |

*Primary Examiner*—Gerald P. Tolin
*Attorney, Agent, or Firm*—T. W. Kennedy

[57] ABSTRACT

A modular electronic system having cooling means has a plurality of stacked electronic circuit units. Each stackable circuit unit has a rectangular frame having a pair of end members which support a plurality of spaced-apart, cooling channels. A cooling passageway extends through each channel along the length thereof and communicates with a cavity in each end member. The cavities form integral entrance and exit plenums for a fluid coolant when a plurality of the circuit units are stacked and aligned. A plurality of dual in line packages or other discrete electronic circuit packages are thermally coupled to one side of the channels with the leads from the packages extending between the channels to the other side thereof where they are connected by wave soldering to a printed circuit board. The individual circuit units are electrically interconnected by male contacts on a transverse member of the frame which cooperate with female contacts on electrical connection boards. A clamping arrangement holds the stacked circuit units in alignment and mounting plates having orifices therein communicating with the circuit unit cavities are provided at the ends of the stack to form a continuous cooling passage, so that fluid coolant is adapted to pass through each of the channels to cool the dual in line packages thereon. Several cooling channel configurations are provided. The circuit units may also be used with modular systems of the type having entrance and exit plenums which are separate from the stacked circuit units.

14 Claims, 12 Drawing Figures

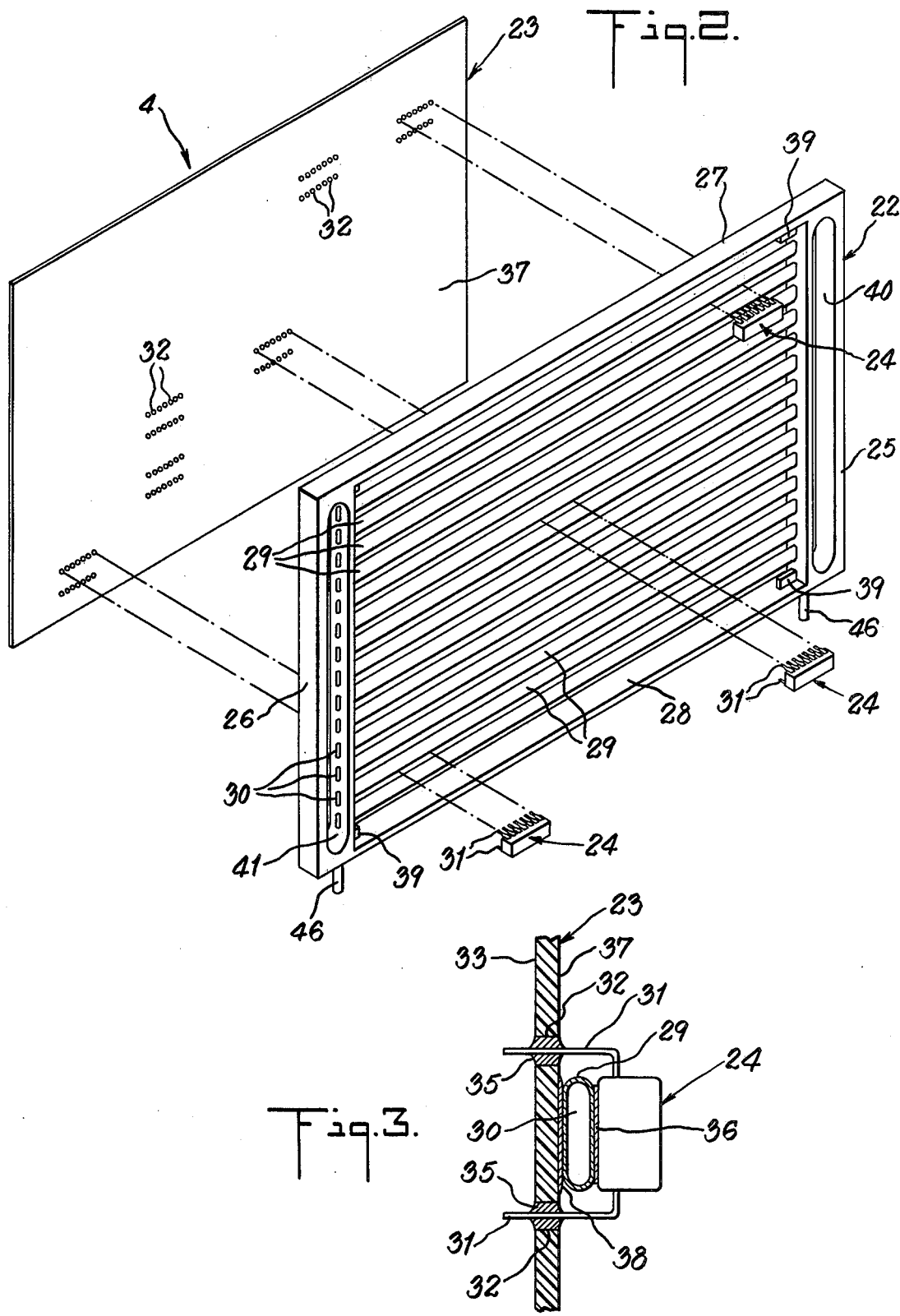

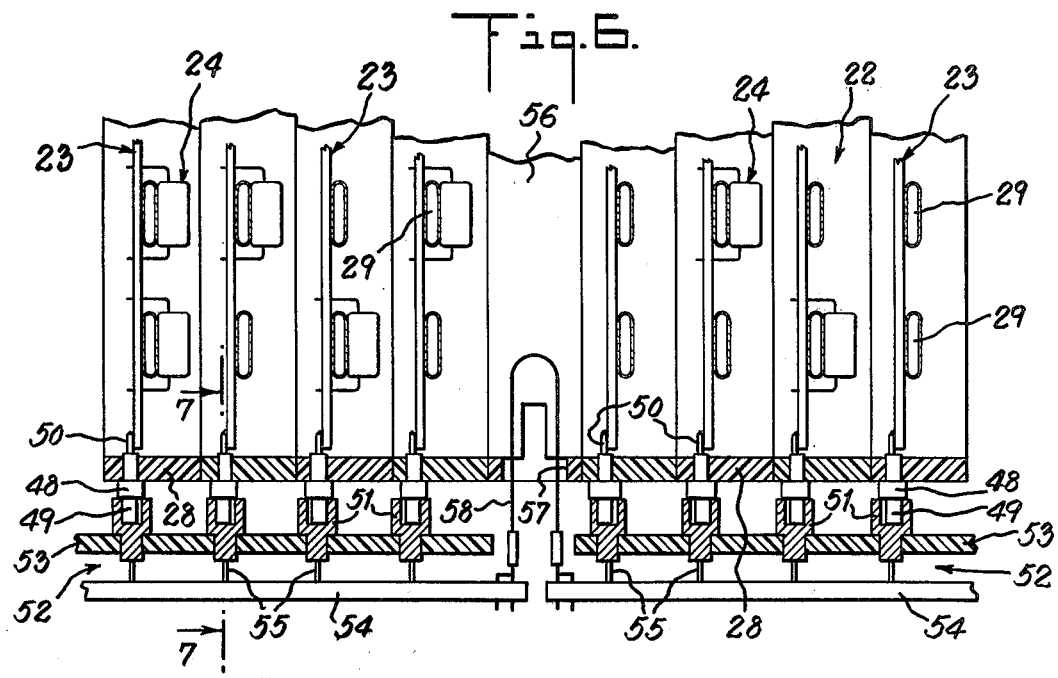
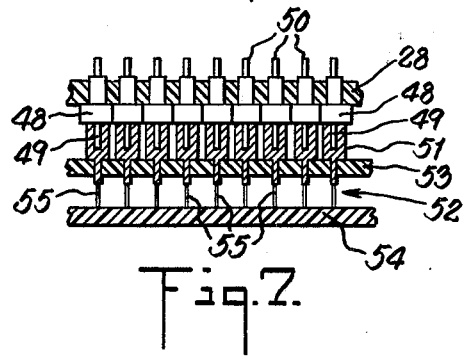
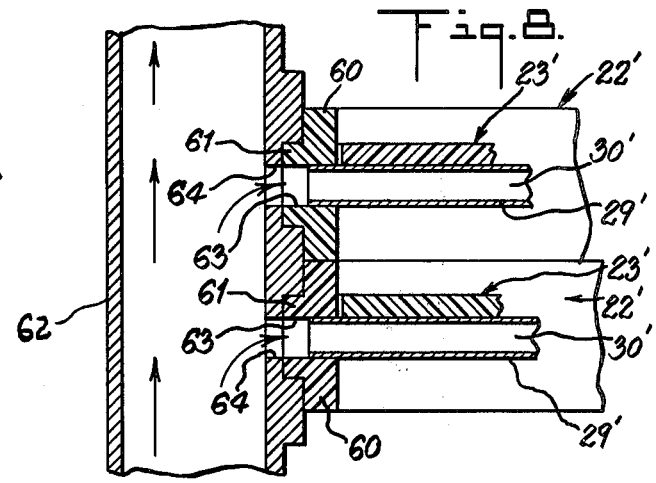
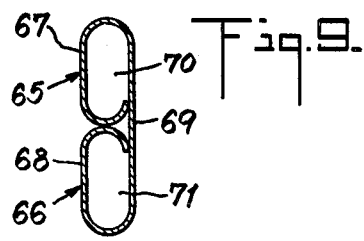
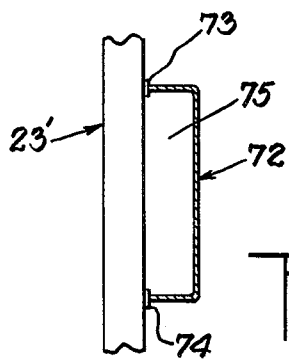
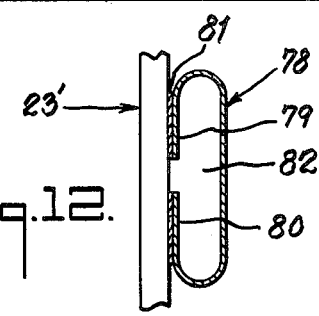

MODULAR ELECTRONIC SYSTEM WITH COOLING MEANS AND STACKABLE ELECTRONIC CIRCUIT UNIT THEREFOR

BACKGROUND OF THE INVENTION

1. Field of the Invention

This invention relates to high-density, electronic packaging arrangements and more particularly to a modular electronic system and stackable electronic circuit unit therefor having a unique cooling configuration which is suitable for the cooling of dual in line packages and other discrete electronic circuit packages and which permits such packages to be connected with wave soldering techniques.

2. Description of the Prior Art

The development of miniaturized solid state electronicomponents and integrated circuits together with the environmental demands of applications, such as aircraft and missile use, for example, have created a need for high-density, electronic packaging arrangements which have adequate power handling capacity and are of small size and weight. For a given volume or size of electronic packaging, an increase in the heat dissipation ability of the package will increase the power handling capacity of the package because of the constant need to provide for adequate cooling of the electronic components. Accordingly, modular electronic systems have been developed which not only reduce the physical size and volume of the package but also increase the power handling capacity of the package through the use of sophisticated cooling techniques. In these systems, the electronic circuitry is broken down into easily-replaceable electronic circuit units or "modules" and a fluid coolant, such as air, for example, is forced through the modular system to dissipate the heat produced by the electronic components. The heat transferred to the fluid coolant is then dissipated in the ultimate heat sink. In addition to the foregoing requirement of good power handling capacity in a small physical size, the modular electronic system must be physically rugged and be able to withstand the high shock and vibration conditions inherent in many applications. The modular electronic system should also be easily expandible to accomodate varying numbers of the modules or circuit units which form the system.

In several prior art arrangements, the modular electronic system is cooled by a large, solid heat sink of thermally conductive material. These arrangements, however, are not thermally efficient and materially add to the size and weight of the system. The electronic circuit units of the system comprise stackable, rectangular "cards" which have one or more solid sheets of heat conductive material, such as copper or aluminum, for example, which are thermally coupled to the electronic components of the card. When the cards are stacked, the ends of the thermally conductive sheets project into a stream of fluid coolant passing through an entrance plenum disposed along one edge of the stack, so that the heat from the components passes by thermal conduction through the sheet to the ends of the sheet and from the ends of the sheets into the stream of coolant. When the electronic circuits to be mounted on the card take the form of discrete electronic circuit packages, such as dual in line packages (DIPS), for example, having specially formed and aligned leads, the solid conductive sheets must be provided with electrically insulated openings to permit the leads from the DIPS to pass through the sheets or, alternatively, the sheets themselves may be replaced by solid, thermally conductive rails. Apart from thermal inefficiency, these arrangements do not uniformly cool the cards in the stack because the ends of the solid, thermally conductive members of the cards are coupled in "series" fashion to the stream of coolant, with the result that the cards nearest the entrance point of the coolant into the entrance plenum receive maximum cooling, while the cards located farthest from the coolant entrance point receive lesser cooling because the coolant is at a higher temperature.

A so-called "hollow card" arrangement has been developed wherein solid sheets of heat conductive material are mounted on both sides of a hollow frame and the circuit components to be cooled are mounted on printed circuit boards which are laminated to the heat conductive sheets. The ends of the cards have openings which form integral entrance and exit plenums which communicate with the hollow space in the card formed by the sheets of heat conductive material so that the fluid coolant passes from one end of the card to the other. This arrangement, which is shown in U.S. Pat. No. 3,648,113 issued Mar. 7, 1972 and assigned to the assignee of the present invention, is thermally efficient and the paths for the fluid coolant through the stacked cards are effectively in parallel between the entrance and exit plenums, so that each card is uniformly cooled and receives fluid coolant at the same temperature. This arrangement, however, is principally suited to the mounting of lap soldered components, such as flat packs and the like. In order to mount DIPS and other discrete electronic circuit packages having similar lead configurations, special lead forming and mounting techniques are required together with the use of special mounting spacers as described in said U.S. Pat. No. 3,648,113. Since DIPS readily lend themselves to modern, automated, wave soldering techniques, it is apparent that a need exists for modular electronic systems and electronic circuit units therefor which will mount and cool DIPS and other discrete electronic circuit packages which are interconnected by wave soldering.

SUMMARY OF THE INVENTION

It is an object of this invention to provide a modular electronic system and a stackable electronic circuit unit therefor having a highly efficient cooling arrangement and which are especially suited for mounting and interconnecting DIPS and other discrete electronic circuit packages.

It is a further object of this invention to provide a modular electronic system and a stackable electronic circuit unit therefor which permit DIPS and other discrete electronic circuit pacakages to be interconnected with highly efficient, wave soldering techniques.

It is a still further object of this invention to provide a modular electronic system and a stackable electronic circuit unit therefor which do not require special lead forming and mounting techniques or the use of special mounting spaces for DIPS and which reduce the thermal conduction path from the DIPS to the fluid coolant to an absolute minimum.

It is an additional object of this invention to provide a modular electronic system and a stackable electronic circuit unit therefor which may be used with either cooling systems of the type having inlet and outlet plenums which are integral with the circuit units or cooling systems of the type having inlet and outlet plenums which are separate from the circuit units.

It is another object of this invention to provide a modular electronic system and a stackable electronic circuit unit therefor which are physically rugged and capable of withstanding high shock and vibration applications.

It is still another object of this invention to provide a modular electronic system of relatively small size and weight which is readily expandable to include either a greater or lesser number of the stackable electronic circuit units comprising the system.

Briefly, the modular electronic system of the invention comprises a plurality of stacked electronic circuit units. Each circuit unit comprises a plurality of elongated, spaced-apart cooling channels and each of the channels has a cooling passageway extending therethrough along the length thereof. A plurality of discrete electronic circuit packages, such as DIPS, for example, are thermally coupled to one side of the channels. Each circuit package has leads extending therefrom between the channels to the other side of the channels. A printed circuit board is disposed on said other side of the channels to interconnect the leads of the circuit packages. A frame is provided for each circuit unit having a pair of end members for supporting the channels and each end member has cavity means therein communicating with the cooling passageways of the cooling channels. The cavity means of one of the emd members is adapted to communicate with an entrance plenum for fluid coolant and the cavity means of the other end member may communicate with an exit plenum, so that fluid coolant from the entrance plenum is adapted to flow through all of the cooling passageways in the stacked circuit units to the exit plenum to thereby cool all of the circuit packages.

The modular electronic system also comprises mounting plates at opposite ends of the stack of circuit units. The mounting plates having a first orifice communicating with the entrance plenum and a second orifice communicating with the exit plenum. The first orifice is adapted to be coupled to a source of fluid coolant. Clamping means are provided for clamping the mounting plates and the stack of circuit units together to form a continuous fluid-tight passage for the fluid coolant comprising the first orifice, the entrance plenum, the cooling passageways, the exit plenum and the second orifice. Electrical connecting means are provided to interconnect the printed circuit boards of the stack of electronic circuit units. The stackable electronic circuit units of the invention may be employed with modular systems of the type having entrance and exit plenums which are integral with the stack of circuit units or modular systems of the type having entrance and exit plenums which are separate from the circuit units. The cooling channels themselves may take any one of a number of configurations as described hereinafter.

The nature of the invention and other objects and additional advantages thereof will be more readily understood by those skilled in the art after consideration of the following detailed description taken in conjunction with the accompanying drawings.

BRIEF DESCRIPTION OF THE DRAWINGS

In the drawings:

FIG. 2 is an exploded perspective view of one of the electronic circuit units of the invention with the electrical connection means eliminated for convenience of illustration;

FIG. 3 is a full sectional view on an enlarged scale of a portion of a circuit unit showing a single DIPS mounted on a cooling channel and connected to the printed circuit board by wave soldering;

FIG. 6 is a sectional view of a portion of the stacked electronic circuit units taken along the line 6—6 of FIG. 5 of the drawings showing the female contacts, the connection board means and a connection tape of the electrical connecting means which interconnect the electronic circuit units;

FIG. 7 is a sectional view taken along the line 7—7 of FIG. 6 of the drawings showing the male contacts of a portion of a single electronic circuit unit connected to the female contacts of the connection board means;

FIG. 8 is a fragmentary sectional view of a stackable electronic circuit unit constituting an alternative embodiment of the invention which may be used with modular electronic systems of the type having entrance and exit plenums which are separate from the stacked circuit units;

FIG. 9 is a lateral sectional view of an alternative form of cooling channel wherein the cooling channel is formed by a pair of flattened tubular members so that two cooling passageways are provided through each channel;

FIG. 10 is a lateral sectional view of another alternative form of cooling channel wherein the cooling channel comprises a channel-shaped member;

FIG. 11 is a plan view of a portion of still another form of cooling channel of the type shown in FIG. 10 of the drawings wherein the channel-shaped member has sections of different widths; and FIG. 12 is a lateral sectional view of still another alternative form of cooling channel wherein the cooling channel comprises a flattened C-shaped member.

DESCRIPTION OF THE PREFERRED EMBODIMENT OF THE INVENTION

Figure 1:
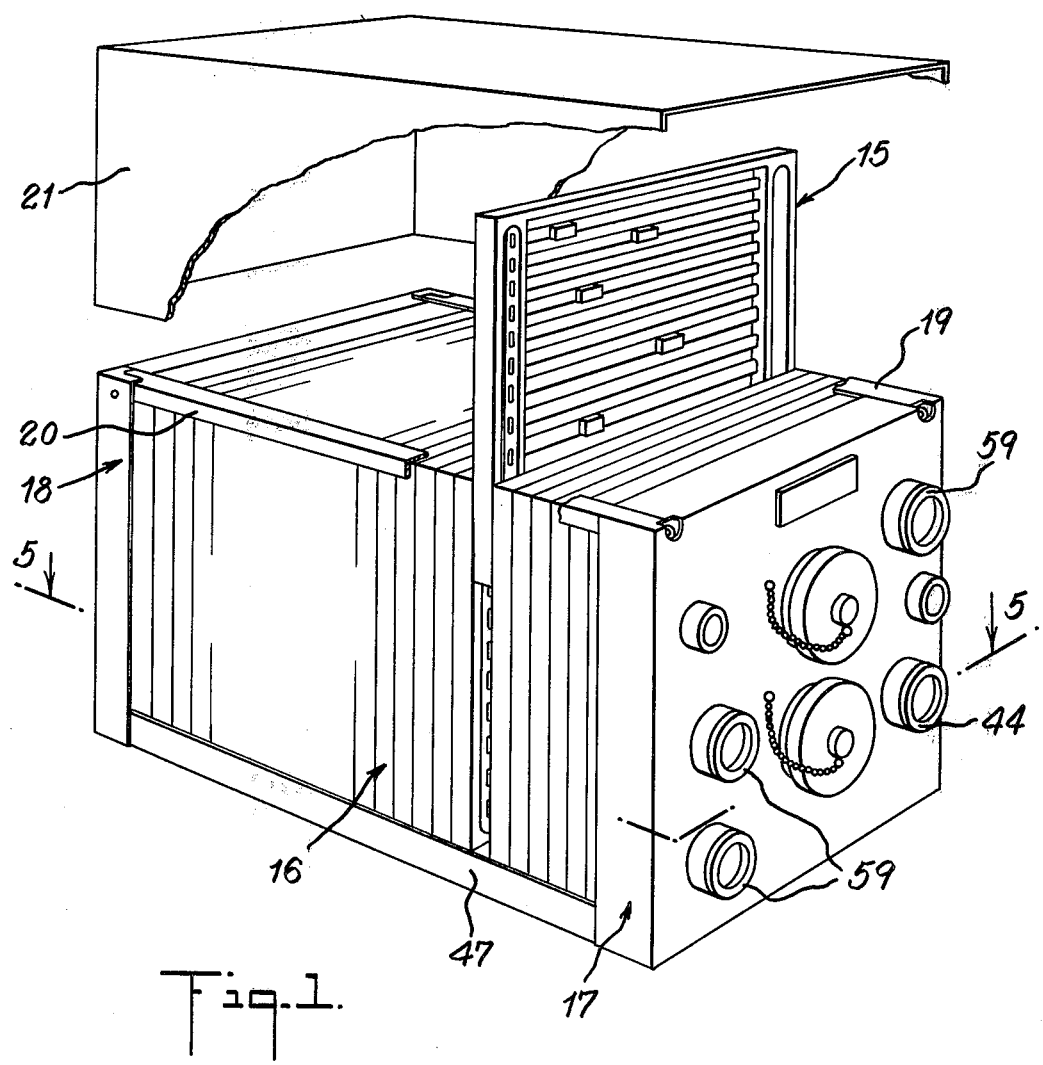
FIG. 1 is a perspective view of a modular electronic system constructed in accordance with the teachings of the present invention with the cover and clamping means partially broken away and one of the electronic circuit units thereof partially withdrawn from the stack to reveal details of construction.

Referring now to FIG. 1 of the drawings, there is shown a modular electronic system constructed in accordance with the teachings of the present invention. The system comprises a plurality of electronic circuit units of cards, indicated generally as 15, which are arranged in a stack 16. Each of the circuit units 15 is a separate section or module of the modular electronic system which may be inserted or removed independently of the remaining circuit units to facilitate replacement and repair of the system. The stack 16 of circuit units is provided with a first mounting plate, indicated generally as 17, which is at one end of the stack and a second mounting plate, indicated generally as 18, which is at the other end of the stack. Hinged clamping means 19 and 20 are provided at the corners of the stack to clamp the first mounting plate 17, the stack 16 and the second mounting plate 18 together in a compact, stacked relationship. A cover 21 is provided to completely enclose the modular electronic system.

The construction of an individual electronic circuit unit 15 is shown in FIG. 2 of the drawings as comprising a substantially rectangular frame, indicated generally as 22, a printed circuit board, indicated generally as 23, and a plurality of discrete electronic circuit packages, such as DIPS, for example, indicated generally as 24. The frame 22 comprises end members 25 and 26 and transverse members 27 and 28. A plurality of substantially parallel, elongated, spaced-apart, cooling channels 29 are supported by the end members 25 and 26 of the frame. As seen in FIGS. 2 and 3 of the drawings, each of the cooling channels 29 has a coupling passageway 30 extending therethrough along the length thereof. Each cooling channel 29 comprises a flattened tubular member having a lateral cross-section with substantially parallel sides and curved ends as shown in FIG. 3. The sides of the tubular members are substantially parallel to the plane of the frame 22. The dual in line packages or DIPS 24 are discrete electronic circuit packages having a number of solid state components therein which are connected to leads 31 which project outwardly from and perpendicular to the plane of the package. The DIPS 24 are thermally coupled to one side of the cooling channels 29 with the leads 31 of the DIPS extending between the channels to the other side thereof where they pass through apertures 32 formed in the printed circuit board 23.

Figure 4:
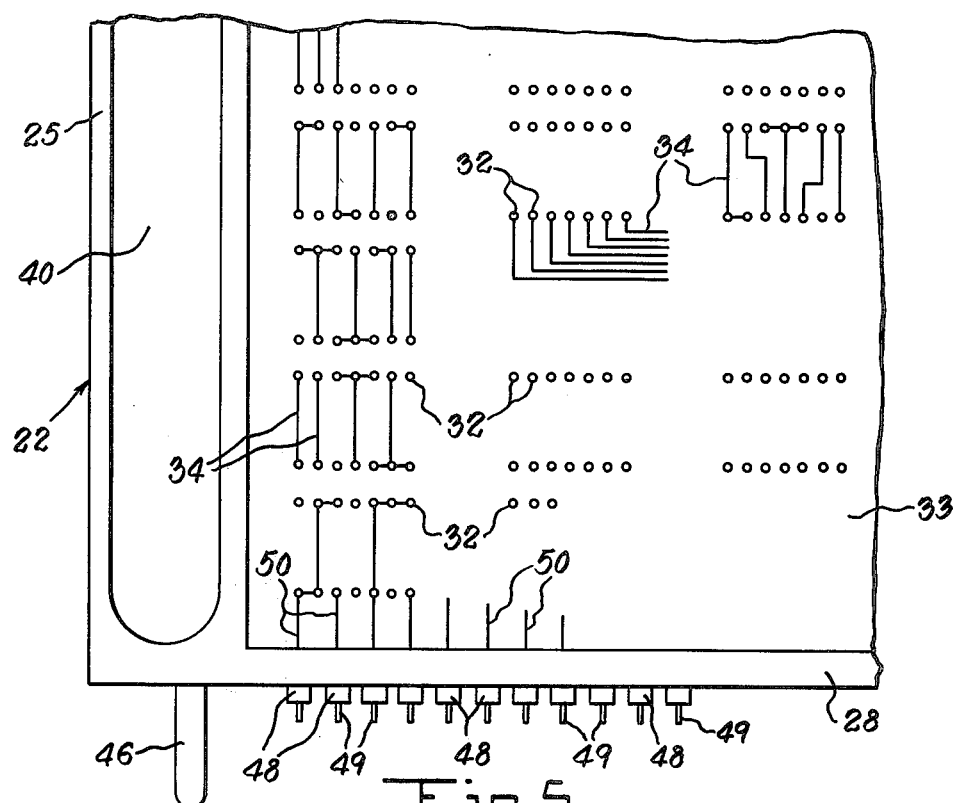
FIG. 4 is a fragmentary elevational view of an electronic circuit unit taken in the direction of the arrow 4 in FIG. 2 of the drawings showing the male contacts of the electrical connecting means disposed along a transverse frame member and electrically connected to the printed circuit board.

As seen in FIG. 4 of the drawings, the side 33 of the printed circuit board 23 which faces away from the frame 22 is provided with a plurality of printed circuits 34 which interconnect the apertures 32. Referring again to FIG. 3 of the drawings, it will be seen that the leads 31 of the DIPS 24 are connected by wave soldering to the printed circuits 34 on the side 33 of the printed circuit board, so that the DIPS of a particular electronic circuit unit may be interconnected with each other and with the DIPS of other electronic circuit units. In wave soldering, molten solder 35 is sucked into the apertures 32 formed in the printed circuit board 23 by highly automated equipment to produce soldered connections which are not only electrically sound but are also relatively inexpensive to produce. The ability of electronic equipment to utilize wave soldering techniques has a great bearing on the reliability of the equipment and also on the cost of producing the equipment. As seen in FIG. 3, the DIPS 24 does not bear directly against the flattened side of the cooling channel 29 but is instead thermally coupled to the side by a layer 36 of thermal coupling material. The function of the layer 36 is not to cause the DIPS 24 to adhere to the side of the cooling channel but rather to insure that all air is excluded from the interface between the DIPS and the cooling channel 29. Since air is a poor conductor of heat, the thermal coupling layer 36 increases the thermal conductivity between the DIPS and the cooling channel. In practice, the thermal coupling layer 36 may comprise a silicone base adhesive or a double-sided tape, for example. The other side of the cooling channel 29 may bear directly against the adjacent side 37 of the printed circuit board 23 or may be coupled thereto by a layer 38 of adhesive as shown in FIG. 3 of the drawings. The layer of adhesive 38 need not have any particular thermal conductivity coefficient since its only function is to mechanically secure the printed circuit board 23 to the frame 22. The printed circuit board 23 may also be secured, by means such as cementing, for example, to lugs 39 which project from the frame 22 so that a mechanically solid construction for the electronic circuit unit results.

Figure 5:
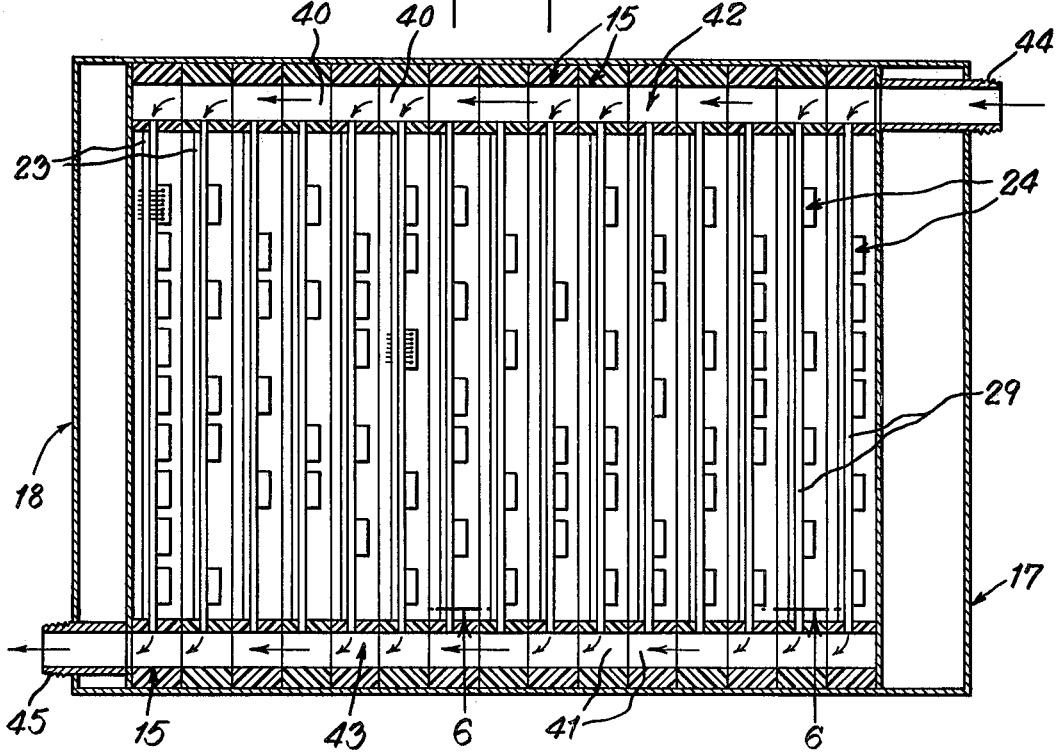
FIG. 5 is a full sectional view taken along the line 5—5 of FIG. 1 of the drawings showing the continuous cooling passage formed through the modular electronic system.

Referring now to FIGS. 1, 2 and 4 of the drawings, it will be seen that the end members 25 and 26 of the frame 22 of each electronic circuit unit are provided with cavity means. The cavity means for the end member 25 comprises an elongated lateral opening 40 which passes through the end member from one side thereof to the other side thereof. In a similar fashion, an elongated lateral opening 41 is provided in the end member 26. Each of the elongated openings 40 and 41 communicates with the cooling passageways 30 of the cooling channels 29. As seen in FIG. 5 of the drawings, when the electronic circuit units 15 are stacked together, the cavity means 40 of the end members 25 of the frames are in alignment and combine to form an elongated entrance plenum, indicated generally as 42, for the modular system which is integral with the electronic circuit units themselves. Similarly, the cavity means 41 of the end members 26 of the frames cooperate with each other to form an integral exit plenum, indicated generally as 43, for the modular system. As seen in FIGS. 1 and 5 of the drawings, the first mounting plate 17 is provided with a first orifice 44 which communicates with the entrance plenum 42 and is adapted to be coupled to a source of fluid coolant, such as air, for example. The second mounting plate 18, which is located at the other end of the stack 16 of circuit units, is provided with a second orifice 45 which communicates with the exit plenum 43 and is adapted to be coupled to the ultimate heat sink. In order to insure a fluid-tight coupling between the openings 40 and 41 of adjacent circuit units, the end members 25 and 26 may be provided with gaskets (not shown) in accordance with known techniques.

By virtue of the foregoing arrangement, fluid coolant is adapted to flow through a fluid-tight passage consisting of the first orifice 44, the entrance plenum 42, the cooling passageways 30 of the cooling channels 29, the exit plenum 43 and the second orifice 45. As seen in FIG. 5, the cooling passageways 30 of the cooling channels 29 are effectively connected in parallel between the entrance and exit plenums so that the fluid coolant entering the cooling passageways of each of the electronic circuit units from the entrance plenum is at substantially the same temperature. Accordingly, the electronic circuit units which are located at the rear of the stack adjacent the second mounting plate 18 will be cooled to the same extent as the electronic circuit units which are located at the front of the stack adjacent the first mounting plate 17 and the entrance orifice 44. This parallel arrangement of the cooling paths for the stacked circuit units offers the additional benefit of a lower pressure drop through the system which often eliminates the need to utilize a high pressure source for the fluid coolant.

In addition to the improved cooling action brought about by the parallel cooling path configuration, it will be noted that the DIPS 24 which are to be cooled are mounted directly on the cooling channels 29, so that the thermal impedance between the DIPS and the fluid coolant in the passageways 30 of the channels is reduced to an absolute minimum. As explained previously, the layer 36 between the DIPS 24 and the sides of the cooling channels 29 is used to exclude air to thereby decrease the thermal impedance of the coupling between the DIPS and the fluid coolant. Accordingly, the thermal impedence between the DIPS and the coolant consists mainly of the thermal impedance of the wall of the cooling channels. The cooling channels may therefore be fabricated of a material, such as aluminum, for example, which has a relatively low thermal impedance. It will also be noted that the unique mounting of the DIPS on the cooling channels permits the leads 31 of the DIPS to be connected to the printed circuit boards 23 by the use of highly automated, wave soldering techniques. The stackable electronic circuit units of the invention together with the clamping arrangement described previously permits the modular electronic system to be easily "expandable" to include either a greater or a lesser number of the stacked electronic circuit units. As seen in FIGS. 2 and 4 of the drawings, the frame 22 of each of the electronic circuit units is provided with a pair of pins 46 which project below the lower transverse member 28 of the frame and which may be seated in openings (not shown) in the base 47 of the modular system as described in said U.S. Pat. No. 3,648,113. Finally, it is seen that the modular electronic system of the invention is of small size and weight and is physically rugged to withstand the high shock and vibration conditions encountered in many applications.

The electrical connection means for interconnecting the stacked electronic circuit units 15 is shown in FIGS. 4, 6 and 7 of the drawings. As seen in FIG. 4, the lower transverse member 28 of each of the frames 22 is provided with a plurality of male contacts 48 which have male contact pins 49 depending therefrom. The male contacts 48 are connected by leads 50 to the printed circuits 34 on the printed circuit board 23 of each circuit unit. As seen in FIG. 6, the male contact pins 49 are seated in a plurality of female contacts 51 which form a part of one or more connection board means or "motherboards", indicated generally as 52, which are disposed beneath the stacked electronic circuit units. Each of the motherboards 52 comprises a structurally rigid connector board portion 53 which supports the plurality of female contacts 51 thereon and a circuit board portion 54 which may comprise an epoxy printed circuit board, for example, which electrically interconnects the electronic circuit units associated with that motherboard. The female contacts 51 are connected by a plurality of leads 55 to the printed circuits on the circuit board portion 54 of the motherboard. A "dummy" electronic circuit unit 56 having an opening 57 formed in the lower transverse frame member thereof is inserted into the stack of circuit units to separate the portions of the stack which are served by individual motherboards. The dummy electronic circuit unit 56 is essentially a frame without the cooling channels and printed circuit boards and serves to separate the adjacent portions of the stack of circuit units to permit a flexible wiring tape 58 to pass through the opening 57 in the lower transverse frame member of the dummy unit to interconnect the printed circuit board portions 54 of adjacent motherboard units. The flexible wiring tape is utilized to provide a tolerance in the electrical connection arrangement to cover the situation where the electronic circuit units 15 are not manufactured to an exact dimension which could produce a longer or a shorter stack for a given number of circuit units. The flexible tape permits the motherboard 52 to physically "float" to accomodate these manufacturing and stacking variations. In practice, the flexible wiring tape may be fabricated from polyethylene terephthalate tape which is available under the trademark "Mylar".

As seen in FIGS. 6 and 7, the male contact pins to and the female contacts 51 are so proportioned that the male pins fit into the female contacts with a loose fit in a direction which is perpendicular to the plane of the individual electronic circuit units and with a tight fit in a direction which is parallel to the plane of the individual circuit units. For example, in FIG. 7, it is seen that little or no movement is possible between the male pins and the female contacts in a direction parallel to the plane of the circuit unit itself. As seen in FIG. 6, however, the electronic circuit units and male contact pins connected thereto may be moved with some degree of freedom in a direction which is perpendicular to the planes of the circuit units. This arrangement insures good electrical contact between the male contact pins and the female contacts while still permitting some manufacturing tolerance in the thickness of the individual electronic circuit units. Accordingly, when a number of the circuit units are stacked together, the contact arrangement permits variations in the length of a particular stack because of manufacturing tolerances. The plurality of stacked electronic circuit units in an individual modular electronic system may be connected to other modular electronic systems by means of various electrical connectors 59 on the first mounting plate 17 as shown in FIG. 1 of the drawings. For further details of the construction of the electrical connection system, reference is made to the said U.S. Pat. No. 3,648,113.

As thus far described, it is seen that the modular electronic system and stackable electronic circuit unit of the invention may have cavity means in the end members thereof which form entrance and exit plenums which are integral with the electronic circuit units. It is believed apparent that the exit plenum 43 could be eliminated, if desired, so that the fluid coolant flowing through the cooling passageways 30 of the channels 29 could vent directly into the atmosphere. Furthermore, it is also apparent that the entrance plenum 42 could be eliminated, so that the fluid coolant could be drawn from the system environment or atmosphere rather than from a separate source of fluid coolant. Another alternative is shown in FIG. 8 of the drawings wherein the modular system utilizes entrance and exit plenums which are separate from the stack of circuit units. In describing FIG. 8, reference numerals with a prime notation will be employed to describe elements which are the same as or similar to elements in the embodiment of FIGS. 1 through 7 of the drawings. The printed circuit board 23', the cooling channels 29' and the circuit packages 24' are arranged in exactly the same manner as the corresponding elements in the embodiment of FIGS. 1 through 7 of the drawings. The end members 60 of the frame 22', however, are provided with a projection 61 which extends the length of the end member and which mates with a corresponding depression or groove formed in a separate entrance plenum 62. Each of the end members 60 is provided with cavity means comprising aperture means 63 which communicate with each of the cooling passageways 30' of the channels 29'. The aperture means 63 in each end member are aligned with the cooling channel passageways and pass through the end member from one end thereof to the other end thereof. The aperture means 63 are connected by passageways 64 in the walls of the plenum 62 to the interior of the plenum. The fluid coolant from the entrance plenum 62 flows through the openings 64 and 63 into each of the cooling passageways 30' and the arrangement functions in exactly the same manner as the integral plenum arrangement shown in FIGS. 1 through 7 of the drawings. An exit plenum (not shown) may be constructed in the same manner. This arrangement permits the use of entrance and exit plenums which are separate from the electronic circuit units themselves. Gaskets (not shown) may be employed between the plenum 62 and the end members 60 of the electronic circuit units to insure a fluid-tight connection.

In the embodiment of the invention shown in FIGS. 1 through 7 of the drawings, each of the cooling channels comprises a flattened tubular member having a lateral cross section with substantially parallel sides and curved ends. The sides of the tubular member are substantially parallel to the plane of the frame. Alternative configurations for the cooling channels are shown in FIGS. 9 through 12 of the drawings. In FIG. 9, each of the cooling channels is shown as comprising a pair of flattened tubular members, indicated generally as 65 and 66. Each tubular member has a lateral cross section with substantially parallel sides and curved ends. Tubular member 65 has a flattened side 67 which is aligned with the corresponding flattened side 68 of tubular member 66. The other flattened side of each of the tubular members 65 and 66 is formed by a single side 69, so that the corresponding sides of the tubular members are aligned with each other and are substantially parallel to the plane of the frame in which the cooling members are mounted. This arrangement provides a pair of cooling passageways 70 and 71 in a single cooling channel rather than a single passageway as shown in the embodiment of FIGS. 1 through 7 of the drawings.

The dual cooling passageway configuration shown in FIG. 9 has a greater thermal cooling efficiency than the configuration shown in FIGS. 1 through 7 of the drawings because the cooling area or interface between the material of the cooling channel itself and the fluid coolant is greatly increased. If a single cooling passageway was to be utilized and the velocity of the fluid coolant through the single passageway increased, the resulting arrangement would be less efficient than the dual cooling passageway configuration illustrated. This follows because the thermal conductivity of an element interfacing with a fluid coolant varies directly as the area of the element in contact with the fluid coolant. On the other hand, however, the heat convection coefficient of the fluid coolant varies as the third power of the cooling velocity. Accordingly, it is less efficient to increase the velocity of the fluid coolant than to increase the area of the interface between the fluid coolant and the cooling channel. As seen in FIG. 9, the dual tubular member configuration provides a much greater heat transfer area than the single tube configuration. If desired, the two tubular members may be fabricated separately or may be fabricated from a single sheet of heat conductive material as shown in FIG. 9, in which case, one side of one of the tubular members is integral with the corresponding side of the other tubular member. The two tubular members may be stamped or may be extruded. If the extrusion method is utilized to fabricate the tubes, any number of cooling passageways may be utilized for a single channel, to thereby provide for an even greater increase in the thermal transfer area.

In the configuration shown in FIG. 10 of the drawings, the cooling channel comprises a channel-shaped member, indicated generally as 72. The free ends 73 and 74 of the member 72 may be cemented to the printed circuit board 23', so that the open side of the channel-shaped member abuts the printed circuit board. In this way, the printed circuit board cooperates with the channel-shaped member to define a cooling passageway 75. Alternatively, the free ends 73 and 74 of the member may be soldered to metallic strips disposed on the printed circuit board. Again, the channel-shaped member may be formed by methods such as stamping or extrusion, for example. As shown in FIG. 11 of the drawings, the use of a channel-shaped member for the cooling channels offers the advantage that the cooling channel may be fabricated with sections having different widths. As seen in FIG. 11, the section 76 of the channel 72 has a substantially greater width than the section 77 of the channel. This arrangement permits a single cooling channel to accomodate DIPS and other discrete electronic circuit packages of different sizes without compromising the cooling efficiency of the channel, since the area of thermal interface between the DIPS and the cooling channel may be changed as desired.

In the cooling channel configuration of FIG. 12 of the drawings, the cooling channel comprises a flattened C-shaped member, indicated generally as 78. The flattened ends 79 and 80 of the C-shaped member, which define the flattened open side of the member, abut the printed circuit board 23' and may be cemented thereto by a thin film of cement 81. Alternatively, the sides 79 and 80 of the member may be soldered to metallic strips on the printed circuit board. The printed circuit board cooperates with the flattened open side of the C-shaped member to define the cooling passageway 82. This configuration of cooling channel is advantageous because the channel is simple to form and offers a good surface area for heat transfer to the fluid coolant. Additionally, this configuration can be made with sections having different widths in the same manner as the channel-shaped configuration of FIGS. 10 and 11 of the drawings, so that DIPS of varying sizes may be accomodated on a single channel.

It is believed apparent that many changes could be made in the construction and described uses of the foregoing modular electronic system and electronic circuit unit and many seemingly different embodiments of the invention could be constructed without departing from the scope thereof. For example, the basic shape of the electronic circuit units could be altered to suit a particular modular electronic system or the clamping means or electrical connection means of the modular system itself could be altered to suit a particular application. Accordingly, it is intended that all matter contained in the above description or shown in the accompanying drawings shall be interpreted as illustrative and not in a limiting sense.

What is claimed is:
1. A stackable electronic circuit unit for modular electronic systems comprising:
(a) a generally rectangular frame defining a central recess and having first and second end portions, at least one of said end portions having therein a cavity;
(b) a printed circuit board mounted to said frame within said recess;
(c) a plurality of elongated cooling channels extending across said printed circuit board between said end portions within said cavity in paralled spaced relationship, each channel open on both ends, said ends abutting against said first and second end portions;

(d) an opening through each frame end portion at the location of said channel ends, said openings at said at least one end portion in communication with said cavity;

(e) adhesive means securing said channels to said printed circuit board;

(f) a plurality of dual in-line circuit modules with extending leads disposed over said channels, with leads on opposite sides of said channels, inserted into and wave soldered to said printed circuit board; and (g) second adhesive means attaching each of said duel in-line circuit modules to a channel to enhance heat transfer and prevent an air insulating barrier.

2. A stackable electronic circuit unit as claimed in claim 1 wherein
the cavity of said one end member comprises an elongated lateral opening passing through said one end member from one side thereof to the other side thereof, so that the cavity for said one end members forms a portion of an integral entrance plenum for fluid coolant when a plurality of the circuit units are stacked together.

3. A stackable electronic circuit unit as claimed in claim 2 wherein
the cavity of the other of said end members comprises an elongated lateral opening passing through said other end member from one side thereof to the other side thereof, so that the cavity for said other end member forms a portion of an integral exit plenum for the fluid coolant when a plurality of the circuit units are stacked together.

4. A stackable electronic circuit unit as claimed in claim 1 wherein
the cavity of said one end member comprises aperture means aligned with the cooling channel passageways and passing through said one end member from one end thereof to the other end thereof, so that the cavity of said one end member is adapted to be coupled to an entrance plenum which is separate from the circuit unit.

5. A stackable electronic circuit unit as claimed in claim 4 wherein
the cavity of the other of said end members comprises aperture means aligned with the cooling channel passageways and passing through said other end member from one end thereof to the other end thereof, so that the cavity of said other end member is adapted to be coupled to an exit plenum which is separate from the circuit unit.

6. A stackable electronic circuit unit as claimed in claim 1 wherein
each of said cooling channels comprises a flattened tubular member having a lateral cross section with substantially parallel sides and curved ends, the sides of said tubular member being substantially parallel to the plane of the frame.

7. A stackable electronic circuit unit as claimed in claim 1 wherein
each of said cooling channels comprises at least two flattened tubular members, each of said tubular members having a lateral cross section with substantially parallel sides and curved ends, the corresponding sides of said tubular members being aligned with each other and substantially parallel to the plane of the frame, so that each of said cooling channels has at least two of said cooling passageways extending therethrough along the length thereof.

8. A stackable electronic circuit unit as claimed in claim 7 wherein
one side of one of said tubular members is integral with the corresponding side of the other of said tubular members, so that said two tubular members may be fabricated from a single sheet of heat conductive material.

9. A stackable electronic circuit unit as claimed in claim 1 wherein
each of said cooling channels comprises a channel-shaped member having the open side thereof abutting said printed circuit board, so that the printed circuit board cooperates with said channel-shaped member to define the cooling passageway for the channel.

10. A stackable electronic circuit unit as claimed in claim 9 wherein
said channel-shaped member has sections of different widths, so that discrete electronic circuit packages of different sizes may be mounted thereon.

11. A stackable electronic circuit unit as claimed in claim 1 wherein
each of said cooling channels comprises a flattened C-shaped member having the flattened open side thereof abutting said printed circuit board, so that the printed circuit board cooperates with said C-shaped member to define the cooling passageway for the channel.

12. A stackable electronic circuit unit as claimed in claim 1 wherein
a plurality of electrical connectors are provided on one of said transverse members of the frame to interconnect the printed circuit boards of the circuit units when a plurality of the circuit units are stacked together.

13. A modular electronic system comprising:
(a) a plurality of stacked electronic circuit units, each of said circuit units having
  i. a generally rectangular frame defining a central recess and having first and second end portions, each of said end portions having therein a cavity, the abutting cavities of respective frames at one end forming an entrance plenum and, at the other end, an exit plenum;
  ii. a printed circuit board mounted to said frame within each said recess;
  iii. a plurality of elongated cooling channels extending across each said printed circuit board between said end portions within each said cavity in paralled spaced relationship, each channel open on both ends, said open ends abutting against said first and second end portions;
  iv. an opening through each frame end portion at the location of said channel ends in communication with a respective cavity;
  v. adhesive means securing said channels to said printed circuit board;
  vi. a plurality of dual in-line circuit modules with extending leads disposed over said channels with leads on opposite sides of said channels inserted into and wave soldered to said printed circuit board; and
  vii. second adhesive means attaching each of said dual in-line circuit modules to a conduit to enhance heat transfer and prevent an air insulating barrier;
(b) mounting plates at opposite ends of said stack of circuit units, said mounting plates having a first orifice communicating with said entrance plenum and a second orifice communicating with said exit plenum, said first orifice being adapted to be coupled to a source of fluid coolant; and
(c) clamping means for clamping said mounting plates and said stack of circuit units together to form a continuous fluid-tight passage for fluid coolant comprising said first orifice, said entrance plenum, said cooling channels said exit plenum and said second orifice.

14. A modular electronic system as claimed in claim 13 wherein said system further comprises electrical connecting means for interconnecting the printed circuit boards of said stack of circuit units, said connecting means having
a plurality of male contacts desposed along one of said transverse members of the frame of each circuit and connected to the printed circuit board of such unit, and
connection board means having a plurality of female contacts thereon for receiving the male contacts of said circuit units.

* * * * *